(12) United States Patent
Gouchi et al.

(10) Patent No.: US 12,119,539 B2
(45) Date of Patent: Oct. 15, 2024

(54) ANTENNA MODULE AND COMMUNICATION DEVICE INCLUDING THE SAME

(71) Applicant: Murata Manufacturing Co., Ltd., Nagaokakyo (JP)

(72) Inventors: Naoki Gouchi, Nagaokakyo (JP); Kengo Onaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 294 days.

(21) Appl. No.: 17/702,799

(22) Filed: Mar. 24, 2022

(65) Prior Publication Data
US 2022/0216585 A1  Jul. 7, 2022

Related U.S. Application Data

(63) Continuation of application No. PCT/JP2020/026834, filed on Jul. 9, 2020.

(30) Foreign Application Priority Data

Sep. 27, 2019  (JP) .................................. 2019-176986

(51) Int. Cl.
*H01Q 1/22* (2006.01)
*H01Q 1/02* (2006.01)
(Continued)

(52) U.S. Cl.
CPC ............ *H01Q 1/2208* (2013.01); *H01Q 1/02* (2013.01); *H01Q 1/20* (2013.01); *H01Q 1/38* (2013.01)

(58) Field of Classification Search
CPC .......... H01Q 1/02; H01Q 1/20; H01Q 1/2208; H01Q 1/2283; H01Q 1/243; H01Q 1/38; H01Q 9/0407; H05K 1/02
See application file for complete search history.

(56) References Cited

U.S. PATENT DOCUMENTS

2005/0024290 A1*  2/2005  Aisenbrey ................ H01Q 1/36
343/873
2006/0134318 A1*  6/2006  Hudd .................. C23C 18/1658
427/123

(Continued)

FOREIGN PATENT DOCUMENTS

WO     2019/167436 A1     9/2019

OTHER PUBLICATIONS

International Search Report and Written Opinion mailed on Oct. 13, 2020, received for PCT Application PCT/JP2020/026834, Filed on Jul. 9, 2020, 16 pages including English Translation.
(Continued)

*Primary Examiner* — Thien M Le
(74) *Attorney, Agent, or Firm* — XSENSUS LLP (57) ABSTRACT

An antenna module includes an antenna substrate including a feed element, and a radio frequency integrated circuit (RFIC) mounted on a lower surface of the antenna substrate. The antenna substrate includes a mount portion on which the RFIC is mounted and an overhang portion that extends outward from the mount portion. The feed element is disposed in the mount portion and the overhang portion. The antenna module further includes a heat dissipator disposed on the lower surface of the overhang portion.

16 Claims, 8 Drawing Sheets

(51) Int. Cl.
*H01Q 1/20* (2006.01)
*H01Q 1/38* (2006.01)

(56) References Cited

U.S. PATENT DOCUMENTS

| | | | | |
|---|---|---|---|---|
| 2007/0229271 | A1* | 10/2007 | Shionoiri | G06K 19/0723 |
| | | | | 340/572.1 |
| 2007/0279230 | A1* | 12/2007 | Lakeman | G06K 19/07749 |
| | | | | 340/572.7 |
| 2011/0006898 | A1* | 1/2011 | Kruest | H01Q 1/2208 |
| | | | | 343/702 |
| 2013/0264390 | A1* | 10/2013 | Frey | C23F 1/02 |
| | | | | 235/492 |
| 2015/0229025 | A1* | 8/2015 | Kalistaja | H05K 3/125 |
| | | | | 427/58 |
| 2016/0056544 | A1 | 2/2016 | Garcia et al. | |
| 2018/0072863 | A1* | 3/2018 | Scheffer | C08K 3/042 |
| 2020/0203292 | A1* | 6/2020 | Kawai | H10K 10/484 |
| 2021/0408658 | A1* | 12/2021 | Pais | H01Q 9/0421 |
| 2022/0101992 | A1* | 3/2022 | Porter | A61B 5/6833 |

OTHER PUBLICATIONS

English Translation of the Written Opinion mailed on Oct. 13, 2020, received for PCT Application PCT/JP2020/026834.

* cited by examiner

ANTENNA MODULE AND COMMUNICATION DEVICE INCLUDING THE SAME

CROSS REFERENCE TO RELATED APPLICATIONS

The present application is a continuation application of International Patent Application No. PCT/JP2020/026834, filed Jul. 9, 2020, which claims priority to Japanese patent application JP 2019-176986, filed Sep. 27, 2019, the entire contents of each of which being incorporated herein by reference.

TECHNICAL FIELD

The present disclosure relates to an antenna module including an antenna substrate including an antenna element and a power supply component (radio-frequency integrated circuit or RFIC) mounted on the antenna substrate, and to a communication device including the antenna module.

BACKGROUND ART

U.S. Patent Application Publication No. 2016/0056544 discloses an antenna module including a planar antenna substrate and a power supply component mounted on a lower surface of the antenna substrate. A first antenna element and a second antenna element are respectively disposed on an upper surface and a lower surface of the antenna substrate. The power supply component is electrically connected to the first antenna element and the second antenna element to supply radio-frequency signals to the first antenna element and the second antenna element.

The antenna substrate has an overhang portion extending outward from a portion on which the power supply component is mounted. The second antenna element is partially disposed on the lower surface of the overhang portion. This structure can increase the area for receiving the antenna element compared to an antenna substrate not including an overhang portion. This structure allows even an antenna substrate with a small area for receiving a power supply component to retain appropriate antenna characteristics.

CITATION LIST

Patent Document

Patent Document 1: U.S. Patent Application Publication No. 2016/0056544

SUMMARY

Technical Problems

A typical power supply component includes an active element such as an amplifier circuit. When the power supply component supplies a radio-frequency signal to the antenna element, the active element in the power supply component generates a large amount of heat. The overhang portion of the antenna substrate extends outward from a portion that receives the power supply component, and heat of the power supply component is also transmitted to the overhang portion. The overhang portion of the antenna substrate is thus desirably used to actively dissipate heat of the antenna module.

However, as recognized by the present inventors, U.S. Patent Application Publication No. 2016/0056544 has no description on heat dissipation using the overhang portion of the antenna substrate, and thus has room for improvement.

The present disclosure is made to solve the above problem, as well as other problems, and aims to provide an antenna module including an antenna substrate and a power supply component, and improving heat dissipation characteristics while retaining antenna characteristics even having a small area for receiving the power supply component.

Example Solutions

The present disclosure provides an antenna module that includes an antenna substrate including a first surface, a second surface opposite to the first surface, and an antenna element, and a power supply component (radio frequency integrated circuit) mounted on the second surface of the antenna substrate and connected to the antenna element. The antenna substrate includes a mount portion on which the power supply component is mounted and an overhang portion that extends outward from the mount portion. At least part of the antenna element is disposed on the first surface in the overhang portion or disposed in a layer between the first surface and the second surface. The antenna module further includes a heat dissipator, that includes a thermally conductive material, disposed on the second surface in the overhang portion.

Another antenna module according to the present disclosure includes an antenna substrate including a first surface, a second surface opposite to the first surface, and an antenna element, and a power supply component mounted on the second surface of the antenna substrate and connected to the antenna element. The antenna substrate includes a mount portion on which the power supply component is mounted and an overhang portion that extends outward from the mount portion. At least part of the antenna element is disposed in the overhang portion on the first surface or between the first surface and the second surface. The mount portion of the antenna substrate includes a rigid substrate and a flexible substrate laminated one on top of another. The overhang portion of the antenna substrate is formed from a flexible substrate without a rigid substrate. The antenna module further includes a heat dissipator that is in contact with the overhang portion.

The antenna substrate in the antenna module includes, in addition to the mount portion on which the power supply component is mounted, the overhang portion that extends outward from the mount portion. This antenna substrate can have a larger area for receiving the antenna element than an antenna substrate not including the overhang portion. This structure allows even an antenna module with a small area for receiving a power supply component (area of the mount portion) to retain antenna characteristics. A heat dissipator is also disposed on the overhang portion. Thus, heat transmitted from the power supply component to the overhang portion can be actively dissipated to the outside of the antenna module from the heat dissipator. Even having a small area for receiving a power supply component, an antenna module with this structure can improve heat dissipation characteristics while retaining antenna characteristics.

Advantageous Effects

According to the present disclosure, an antenna module including an antenna substrate and a power supply component can improve heat dissipation characteristics while retaining antenna characteristics even when having a small area for receiving the power supply component.

DESCRIPTION OF EMBODIMENTS

Embodiments of the present disclosure will be described in detail below with reference to the drawings. The same or similar components throughout the drawings are denoted with the same reference signs without redundant description.
(Basic Structure of Communication Device)

Figure 1:
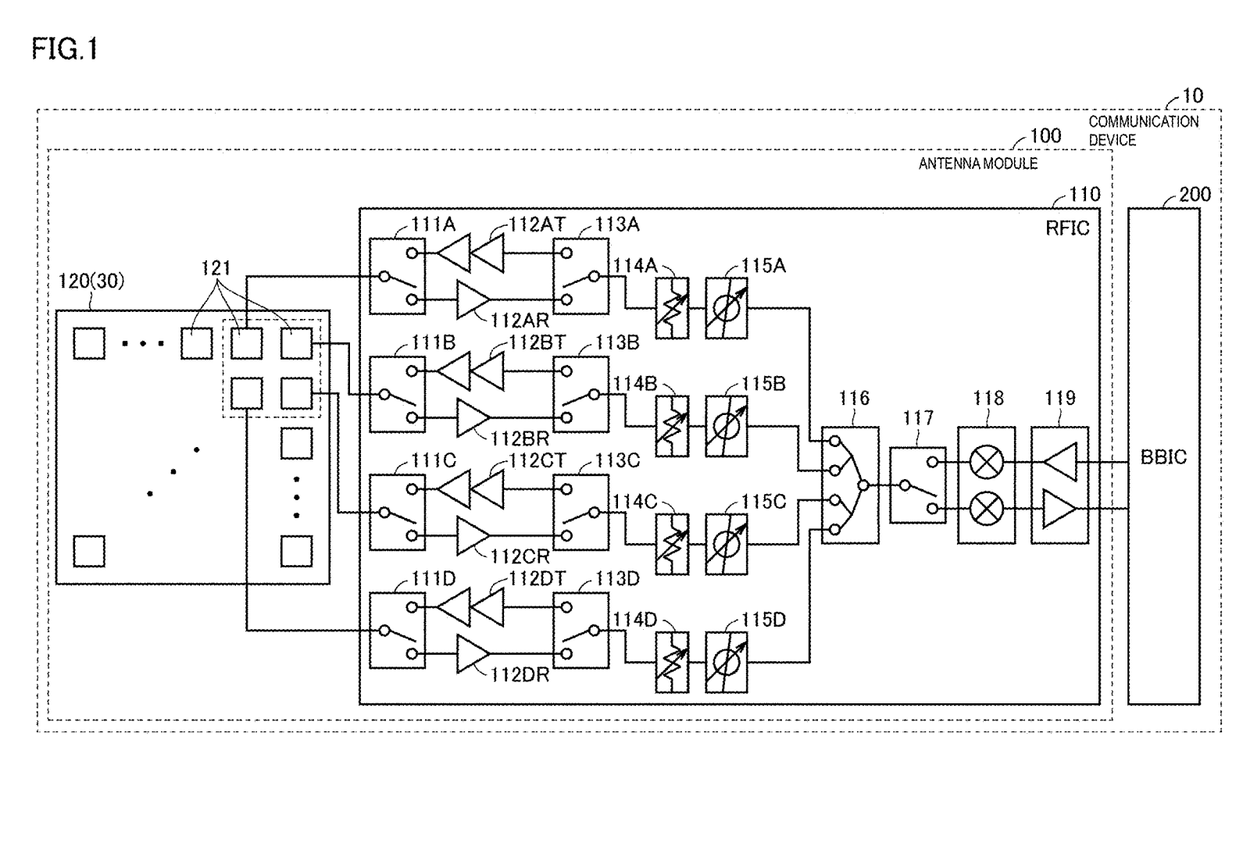
FIG. 1 is an example block diagram of a communication device.

FIG. 1 illustrates an example of a block diagram of a communication device 10 including an antenna module 100 according to an embodiment. Examples of the communication device 10 include a mobile terminal such as a mobile phone, smartphone, or tablet computer, and a personal computer including a communication function.

With reference to FIG. 1, the communication device 10 includes the antenna module 100 and a baseband integrated circuit (BBIC) 200 forming a baseband signal processing circuit. The antenna module 100 includes a radio frequency integrated circuit (RFIC) 110, serving as an example of a power supply component, and an antenna device 120 (antenna substrate 30). The communication device 10 upconverts a signal transmitted from the BBIC 200 to the antenna module 100 into a radio-frequency signal and emits the signal from the antenna device 120, and downconverts the radio-frequency signal received at the antenna device 120 and processes the signal at the BBIC 200.

The antenna device 120 includes multiple feed elements 121. For ease of illustration, FIG. 1 only illustrates a structure for four of the multiple feed elements 121 included in the antenna device 120, and omits the structure for the remaining feed elements 121 having the similar structure. Although FIG. 1 illustrates an example where the antenna device 120 includes multiple feed elements 121 arranged in a two-dimensional array, the antenna device 120 does not have to include multiple feed elements 121, and may include a single feed element 121. In the present embodiment, each feed element 121 is a patch antenna having a substantially square planar board shape.

The RFIC 110 includes switches 111A to 111D, 113A to 113D, and 117, power amplifiers 112AT to 112DT, low-noise amplifiers 112AR to 112DR, attenuators 114A to 114D, phase shifters 115A to 115D, a signal multiplexer/demultiplexer 116, a mixer 118, and an amplifier circuit 119.

To transmit radio-frequency signals, the switches 111A to 111D and 113A to 113D are switched to the power amplifiers 112AT to 112DT, and the switch 117 is connected to a transmission amplifier of the amplifier circuit 119. To receive radio-frequency signals, the switches 111A to 111D and 113A to 113D are switched to the low-noise amplifiers 112AR to 112DR, and the switch 117 is connected to a reception amplifier of the amplifier circuit 119.

A signal transmitted from the BBIC 200 is amplified by the amplifier circuit 119, and upconverted by the mixer 118. The upconverted transmitted signal, which is a radio-frequency signal, is divided into four waves by the signal multiplexer/demultiplexer 116, and the four waves are fed to the respective feed elements 121 through four signal paths. The phase shifters 115A to 115D located on the respective signal paths have the shift degrees individually adjusted to enable adjustment of the directivity of the antenna device 120.

The received signals, which are radio-frequency signals received by the respective feed elements 121, pass the respective four signal paths, and are multiplexed by the signal multiplexer/demultiplexer 116. The multiplexed received signal is downconverted by the mixer 118, amplified by the amplifier circuit 119, and transmitted to the BBIC 200.

The RFIC 110 is, for example, a single-chip integrated circuit component including the above circuit structure. Alternatively, devices (switches, power amplifiers, low-noise amplifiers, attenuators, or phase shifters) in the RFIC 110 corresponding to the feed elements 121 may each be formed as a single-chip integrated circuit component for the corresponding feed element 121.
(Arrangement of Antenna Module)

Figure 2:
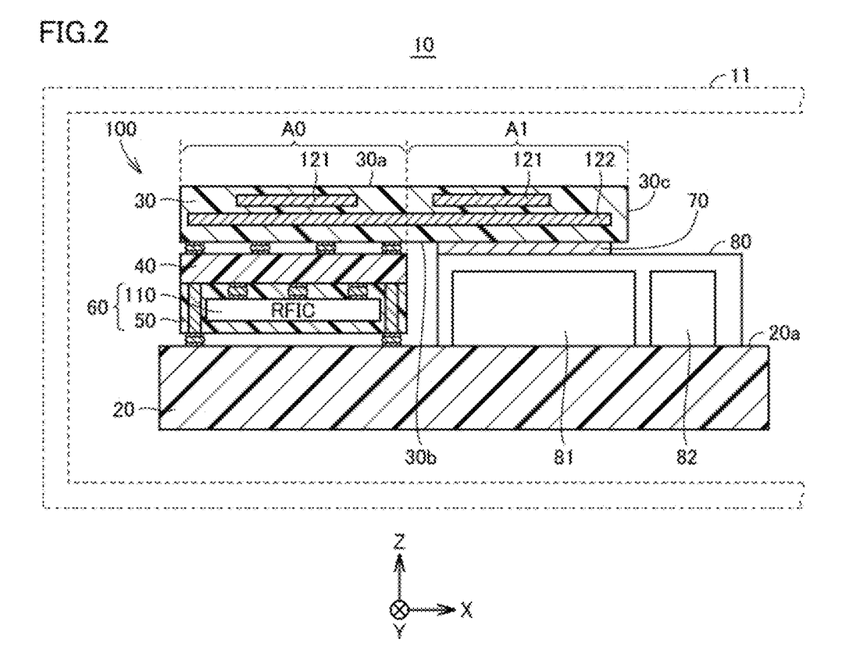
FIG. 2 is a perspective view of an inside of a communication device.

FIG. 2 is a perspective view of an inside of the communication device 10. The communication device 10 is covered with a housing 11. A housing 11 accommodates components such as the antenna module 100, a mount substrate 20, a heat dissipator 70, and a shielding case 80. The antenna module 100 includes an antenna substrate 30 included in the antenna device 120, an RF module 60 including the RFIC 110, and a circuit board 40.

The antenna substrate 30 and the circuit board 40 may each be formed from, for example, low temperature co-fired ceramics (;TCC), a printed circuit board, or a flexible substrate.

The antenna substrate 30 includes an upper surface 30a, a lower surface 30b opposite to the upper surface 30a, a side surface 30c connecting the upper surface 30a and the lower surface 30b, multiple planar feed elements 121, and a planar ground electrode 122. Hereinbelow, a direction normal to the upper surface 30a of the antenna substrate 30 is also referred to as "a Z-axis direction", a direction normal to the side surface 30c of the antenna substrate 30 is also referred to as "an X-axis direction", and a direction perpendicular to the Z-axis direction and the X-axis direction is also referred to as "a Y-axis direction".

FIG. 2 illustrates an example where two feed elements 121 are arranged side-by-side in the X-axis direction (along the upper surface 30a). The two feed elements 121 are disposed in a layer between the upper surface 30a and the lower surface 30b of the antenna substrate 30. Each feed element 121 may be disposed on the upper surface 30a of the antenna substrate 30.

The ground electrode 122 is disposed in a layer in the antenna substrate 30 between the feed elements 121 and the lower surface 30b, and extends in the X-axis direction (in a direction along the upper surface 30a). The feed elements 121 and the ground electrode 122 form a patch antenna.

The upper surface 30a, the lower surface 30b, the feed elements 121, and the ground electrode 122 may respectively correspond to "an antenna substrate", "a first surface", "a second surface", "an antenna element", and "a ground electrode" in the present disclosure.

The RF module 60 is formed by sealing the RFIC 110 in a resin molding member 50. The RFIC 110 of the RF module 60 is mounted on the lower surface 30b of the antenna substrate 30 with the circuit board 40 interposed therebetween. Wires (or more generally conductors) that connect the RFIC 110 to each of the feed elements 121 of the antenna substrate 30 are arranged on the circuit board 40. In other words, the RFIC 110 is connected to each of the feed elements 121 with the circuit board 40 interposed therebetween, and supplies radio-frequency (RF) signals to each feed element 121. A combination of the antenna substrate 30 and the circuit board 40 may correspond to "an antenna substrate" in the present disclosure. Alternatively, the RFIC 110 may be directly mounted on the lower surface 30b of the antenna substrate 30 without including the circuit board 40. When the circuit board 40 is eliminated, the antenna substrate 30 may correspond to "an antenna substrate" in the present disclosure. The RFIC 110 may correspond to "a power supply component" in the present disclosure.

The mount substrate 20 is located across from the antenna substrate 30 with the RF module 60 interposed therebetween. The RF module 60 is mounted on an upper surface 20a of the mount substrate 20. The mount substrate 20 may correspond to "a mount substrate" in the present disclosure.

The shielding case 80 is located adjacent to the RF module 60 and between the heat dissipator 70 and the mount substrate 20. Thus, the RF module 60 and the shielding case SO are disposed adjacent to each other on the upper surface 20a of the mount substrate 20.

The shielding case 80 is formed from a grounded conductor. The upper surface of the shielding case 80 is in contact with the heat dissipator 70, and the lower surface of the shielding case SO is in contact with the upper surface 20a of the mount substrate 20. The shielding case 80 accommodates electronic components 81 and 82 (such as a power supply circuit and an inductor). The electronic components 81 and 82 accommodated in the shielding case 80 are protected from electromagnetic noise (which electromagnetic interference, EMI, as used in this description) from components external to the shielding case 80 (such as the feed elements 121). In addition, the effect of the electromagnetic noise from the electronic components 81 and 82 (such as switching noise caused by the power supply circuit) on components out of the shielding case 80 (such as the feed elements 121) is reduced.

As described above, the upper surface 20a of the mount substrate 20 receives, besides the RF module 60, the shielding case 80 adjacent to the RF module 60. Thus, the area of the upper surface 20a of the mount substrate 20 for receiving the RF module 60 is restricted by the area for receiving the shielding case 80, and thus prevented from further size increase.

In view of this, the antenna substrate 30 according to the present embodiment includes, besides a mount portion AO on which the RF module 60 is mounted, an overhang portion Al that extends outward (in an X-axis positive direction) from the mount portion A0. The two feed elements 121 are respectively disposed in the mount portion A0 and the overhang portion A1 of the antenna substrate 30. The ground electrode 122 extends throughout the antenna substrate 30 including the mount portion A0 and the overhang portion A1. Thus, the area for receiving the feed elements 121 and the ground electrode 122 can be further increased than in the antenna substrate 30 not including the overhang portion A1. Thus, even when having a small area for receiving the RF module 60, the antenna module 100 can retain antenna characteristics.

The RFIC 110 in the RF module 60 includes active elements such as the amplifier circuit 119 and the power amplifiers 112AT to 112DT. When the RFIC 110 supplies radio-frequency signals to the feed elements 121, the active elements in the RFIC 110 generate a large amount of heat.

Heat generated in the RFIC 110 is also transmitted to the mount portion A0 and the overhang portion A1 of the antenna substrate 30. Thus, heat transmitted from the RFIC 110 to the overhang portion A1 is preferably actively dissipated to the outside of the antenna module 100.

In view of this, the heat dissipator 70 is disposed on the lower surface 30b in the overhang portion A1 in the antenna substrate 30 according to the present embodiment. The heat dissipator 70 is formed from a highly thermally conductive material such as a copper electrode or a graphite sheet. The term "thermally conductive material" may include a single material or multiple materials, but collectively they are referred to as a thermally conductive material. Thus, heat transmitted from the RFIC 110 to the overhang portion A1 can be actively dissipated from the heat dissipator 70 to the outside of the antenna module 100.

In the above example illustrated in FIG. 2, the heat dissipator 70 is located within the lower surface 30b in the overhang portion A1. Instead, the heat dissipator 70 may extend to the lower surface 30b of the mount portion A0 from the lower surface 30b in the overhang portion A1. Alternatively, the heat dissipator 70 may extend to the side surface 30c from the lower surface 30b in the overhang portion A1. Still alternatively, the heat dissipator 70 may be divided into a member disposed on the lower surface 30b in the overhang portion A1 and a member disposed on the side surface 30c of the overhang portion A1.

In the present embodiment, the shielding case 80 is in contact with the heat dissipator 70, and thus, heat of the overhang portion A1 can be actively dissipated to the shielding case 80. Thus, the antenna module 100 can improve heat dissipation characteristics. A structure not including the shielding case 80 can also dissipate heat into the air through the overhang portion A1.

In the antenna module 100 according to the present embodiment, the shielding case 80 is disposed between the heat dissipator 70 and the mount substrate 20 and in contact with the heat dissipator 70 and the mount substrate 20. Thus, heat of the overhang portion A1 can be actively released to the shielding case 80 and the mount substrate 20 from the heat dissipator 70. Thus, heat of the overhang portion A1 can be more efficiently dissipated to the outside.

The antenna module 100 according to the present embodiment can thus improve heat dissipation characteristics while retaining antenna characteristics. The mount portion A0, the overhang portion A1, the heat dissipator 70, and the shielding case 80 may respectively correspond to "a mount portion", "an overhang portion", "a heat dissipator" (or "thermally conductive material"), and "a contact member" in the present disclosure.

MODIFICATION EXAMPLE

Modification Example 1

Figure 3:
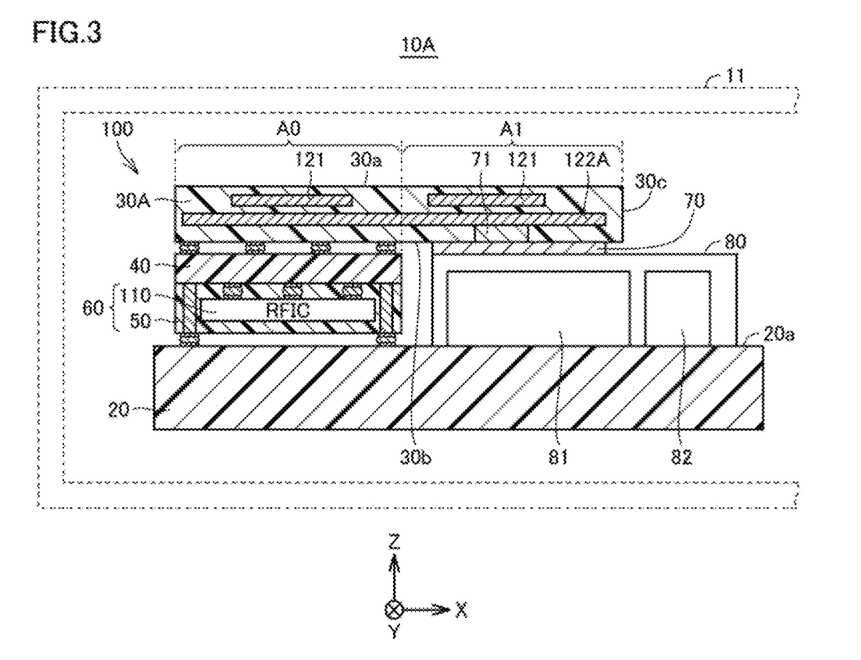
FIG. 3 is a perspective view of an inside of a communication device according to Modification Example 1.

FIG. 3 is a perspective view of an inside of a communication device 10A according to Modification Example 1.

The communication device 10A includes an antenna substrate 30A, instead of the antenna substrate 30 in the communication device 10. The antenna substrate 30A is formed by adding, to the antenna substrate 30, an electrically conductive member 71 (also referred to an electrically conductive material) that connects the ground electrode 122 and the heat dissipator 70. The electrically conductive member 71 is formed from a highly thermally conductive material such as a copper electrode or an electrically conductive paste. The electrically conductive member 71 is, for example, a via, pillar, or post (of any cross-sectional shape).

In this modification, heat generated in the RFIC 110 can be efficiently transmitted to the heat dissipator 70 via the ground electrode 122 and the electrically conductive member 71 in the antenna substrate 30. Thus, the antenna module 100 can further improve heat dissipation characteristics. "The electrically conductive member 71" in Modification Example 1 may correspond to "an electrically conductive member" (or electrically conductive material) in the present disclosure.

Modification Example 2

Figure 4:
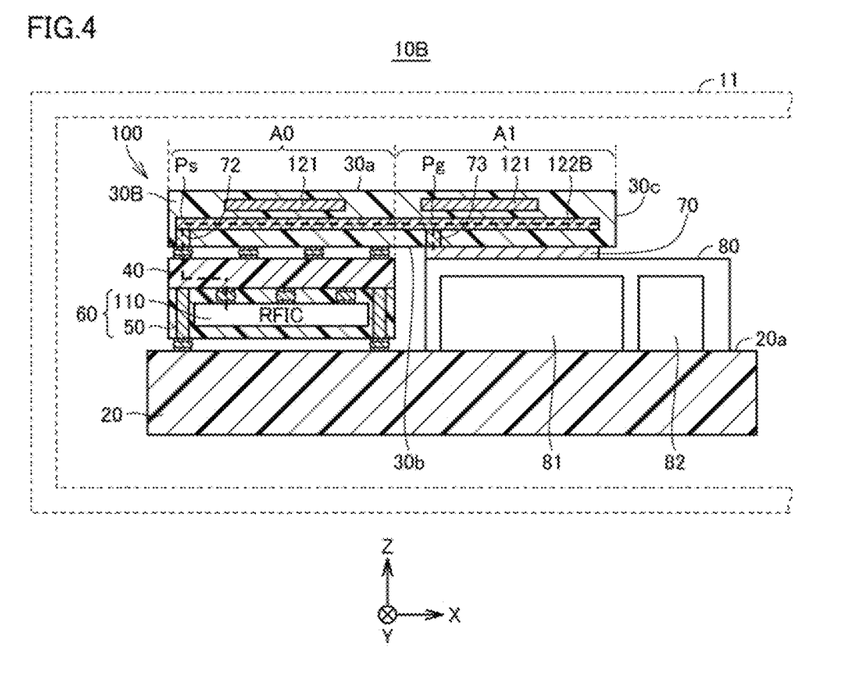
FIG. 4 is a perspective view of an inside of a communication device according to Modification Example 2.

FIG. 4 is a perspective view of an inside of a communication device 10B according to Modification Example 2. The communication device 10B includes an antenna substrate 30B instead of the antenna substrate 30 in the communication device 10. The antenna substrate 30B includes a ground electrode 122B instead of the ground electrode 122 in the antenna substrate 30, and additionally includes electrically conductive members 72 and 73.

The electrically conductive member 72 electrically connects a feeder Ps (or a feed line) in the ground electrode 122B to the RFIC 110. The electrically conductive member 73 electrically connects a grounded portion Pg in the ground electrode 122B to the heat dissipator 70. In other words, the ground electrode 122B includes the feeder Ps that feeds power from the RFIC 110 through the electrically conductive member 72, and the grounded portion Pg grounded through the electrically conductive member 73, the heat dissipator 70, and the shielding case 80. Thus, the ground electrode 122B can function as an inverted-F antenna. More specifically, when the RFIC 110 supplies radio-frequency signals to the feed elements 121, the ground electrode 122B functions as a ground electrode of each feed element 121 (patch antenna). On the other hand, when the RFIC 110 supplies radio-frequency signals to the feeder Ps in the ground electrode 122B, the ground electrode 122B functions as an inverted-F antenna that radiates electric waves. When the ground electrode 122B functions as an inverted-F antenna, since the heat dissipator 70 contains an electrically conductive material, the grounded portion Pg in the ground electrode 122B is grounded through the electrically conductive member 73, the heat dissipator 70, and the shielding case 80. The feeder Ps may be a feeding point (start point of quarter wavelength), or may be anything other than a feeding point (another feeding point may be provided separately from the feeder Ps).

Thus, the ground electrode 122B of the patch antenna may be modified to also function as an inverted-F antenna. Thus, the antenna module 100 can include both a patch antenna and an inverted-F antenna, and can thus improve communication performance. "The grounded portion Pg" and "the feeder Ps" in Modification Example 2 may respectively correspond to "a grounded portion" and "a feeder" in the present disclosure.

Modification Example 3

Figure 5:
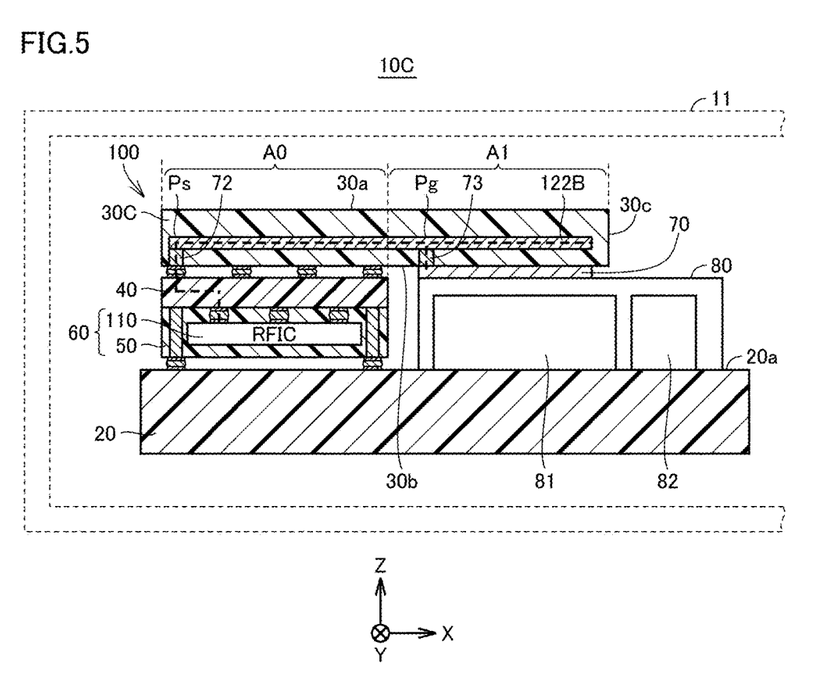
FIG. 5 is a perspective view of an inside of a communication device according to Modification Example 3.

FIG. 5 is a perspective view of an inside of a communication device 10C according to Modification Example 3. The communication device 10C includes an antenna substrate 30C instead of the antenna substrate 30B in the communication device 10B illustrated in FIG. 4. The antenna substrate 30C is formed by excluding the feed elements 121 from the antenna substrate 30B illustrated in FIG. 4.

In this manner, the antenna module 100 may be modified to function as an inverted-F antenna instead of a patch antenna. Thus, the antenna module 100 can have antenna characteristics different from the characteristics of a patch antenna. The antenna module 100 may be modified to function as an antenna (such as a dipole antenna) other than the patch antenna and the inverted-F antenna.

Modification Example 4

Figure 6:
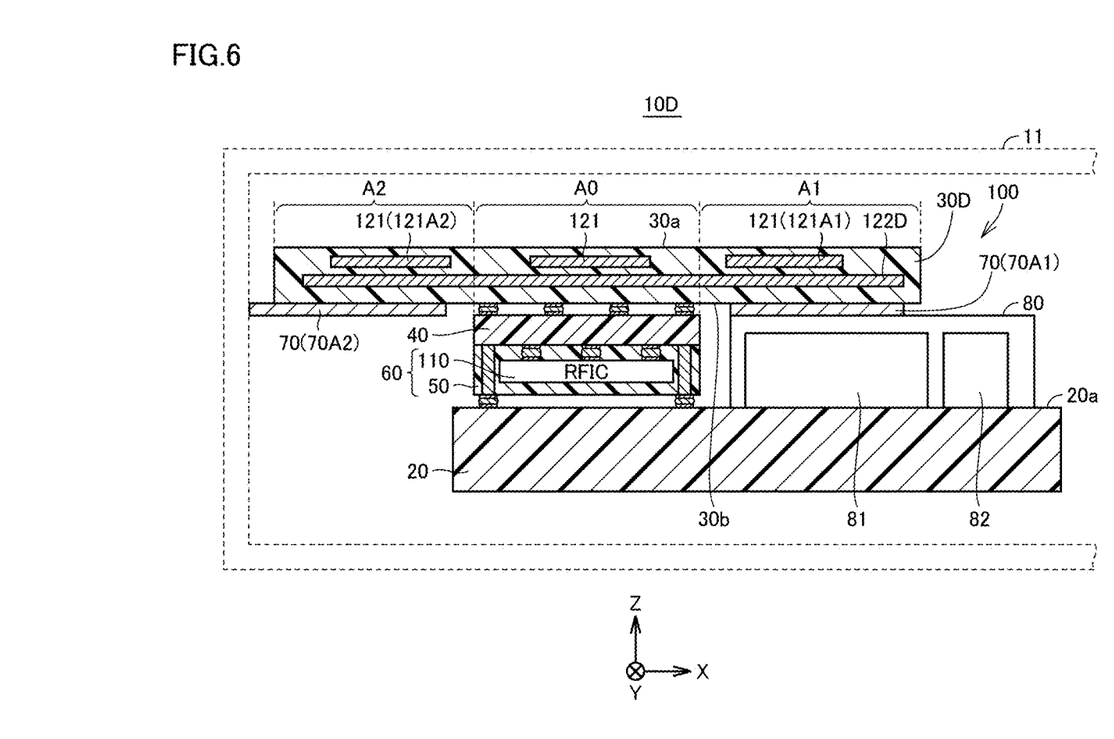
FIG. 6 is a perspective view of an inside of a communication device according to Modification Example 4.

FIG. 6 is a perspective view of an inside of a communication device 10D according to Modification Example 4. The communication device 10D includes an antenna substrate 30D instead of the antenna substrate 30 in the communication device 10. The antenna substrate 30D is formed by adding, to the antenna substrate 30, an overhang portion A2 that extends in an X-axis negative direction from the mount portion A0. In other words, the antenna substrate 30D includes, besides the overhang portion A1 extending in the first direction (X-axis positive direction) from the mount portion A0, the overhang portion A2 that extends from the mount portion A0 in a second direction (X-axis negative direction in an example illustrated in FIG. 6) different from the first direction.

The feed element 121 is disposed in the overhang portion A1. The heat dissipator 70 is disposed on a lower surface 30b in the overhang portion A1. Another feed element 121 is disposed in the overhang portion A2. Another heat dissipator 70 is disposed on the lower surface 30b in the overhang portion A2. A ground electrode 122D extends throughout an antenna substrate 30D including the mount portion A0 and the overhang portions A1 and A2. The antenna substrate thus including the overhang portions A1 and A2 on both sides of the mount portion A0 can retain a large area for receiving the feed elements 121 and the ground electrode 122, and the antenna module 100 can further improve heat dissipation characteristics.

Hereinbelow, the feed element 121 and the heat dissipator 70 disposed on the overhang portion A1 are also respectively described as "a feed element 121A1" and "a heat dissipator 70A1", and the feed element 121 and the heat dissipator 70 disposed on the overhang portion A2 are also respectively described as "a feed element 121A2" and "a heat dissipator 70A2".

The side surface, in the X-axis negative direction, of a heat dissipator 70A2 disposed on the overhang portion A2 is in contact with the housing 11. Thus, heat of the overhang portion A2 can be actively released to the housing 11 from the heat dissipator 70A2. While the antenna substrate 30D is formed from a flexible substrate, the heat dissipator 70A2 may have the entire surface in contact with the housing 11 while having the end portion of the overhang portion A2 in the X-axis negative direction being bent to follow the shape of the housing 11.

"The overhang portion A1", "the overhang portion A2", "the feed elements 121A1", "the feed elements 121A2", "the heat dissipator 70A1", and "the heat dissipator 70A2"

according to Modification Example 4 may respectively correspond to "a first overhang portion", "a second overhang portion", "a first antenna element", "a second antenna element", "a first heat dissipator", and "a second heat dissipator" in the present disclosure.

Modification Example 5

Figure 7:
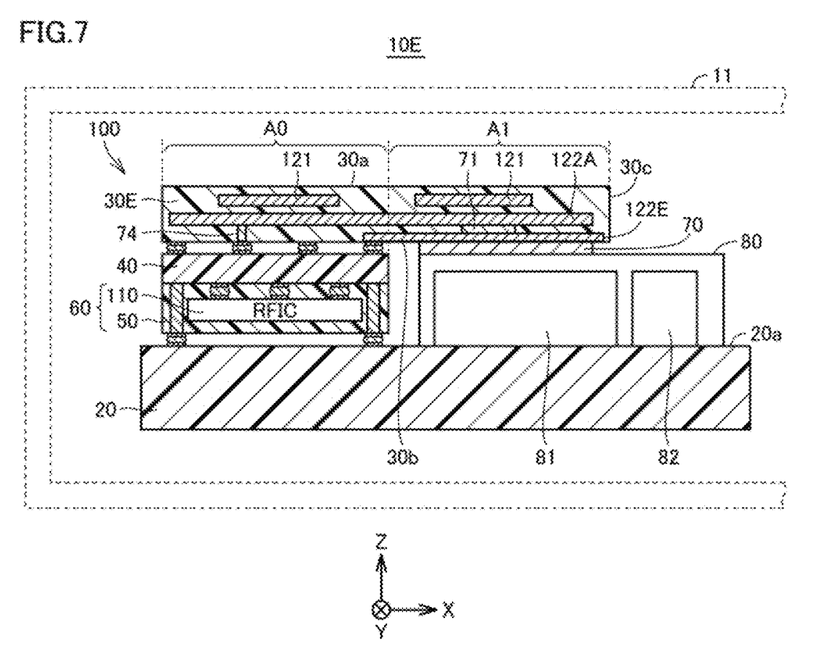
FIG. 7 is a perspective view of an inside of a communication device according to Modification Example 5.

FIG. 7 is a perspective view of an inside of a communication device 10E according to Modification Example 5. The communication device 10E includes an antenna substrate 30E instead of the antenna substrate 30A illustrated in FIG. 3. The antenna substrate 30E is formed by adding, to the antenna substrate 30A, a via 74 and a ground electrode 122E.

The via 74 has a first end connected to a ground electrode 122A and a second end connected to the circuit board 40. The ground electrode 122A is electrically connected to the circuit board 40 through the via 74. Thus, heat of the RFIC 110 can be more efficiently transmitted to the overhang portion A1 through the via 74 and the ground electrode 122A.

The ground electrode 122E is disposed closer to the lower surface 30b of the antenna substrate 30E than the ground electrode 122A of the patch antenna, and is electrically connected to the circuit board 40 at a first end. The ground electrode 122E electrically connected to the circuit board 40 and disposed closer to the surface of the antenna substrate 30E than the ground electrode 122A of the patch antenna can more efficiently transmit heat of the RFIC 110 to the heat dissipator 70, and can thus further improve heat dissipation characteristics.

Modification Example 6

Although the antenna substrate 30 illustrated in FIG. 2 is a rigid substrate or a flexible substrate, the antenna substrate 30 may have a laminate structure including a rigid substrate and a flexible substrate. In this case, the ground electrode 122 may be disposed in the flexible substrate, and the antenna elements 121 may be disposed in the rigid substrate. The rigid substrate may be mounted on the flexible substrate or connected to the flexible substrate by, for example, adhesion.

Modification Example 7

Figure 8:
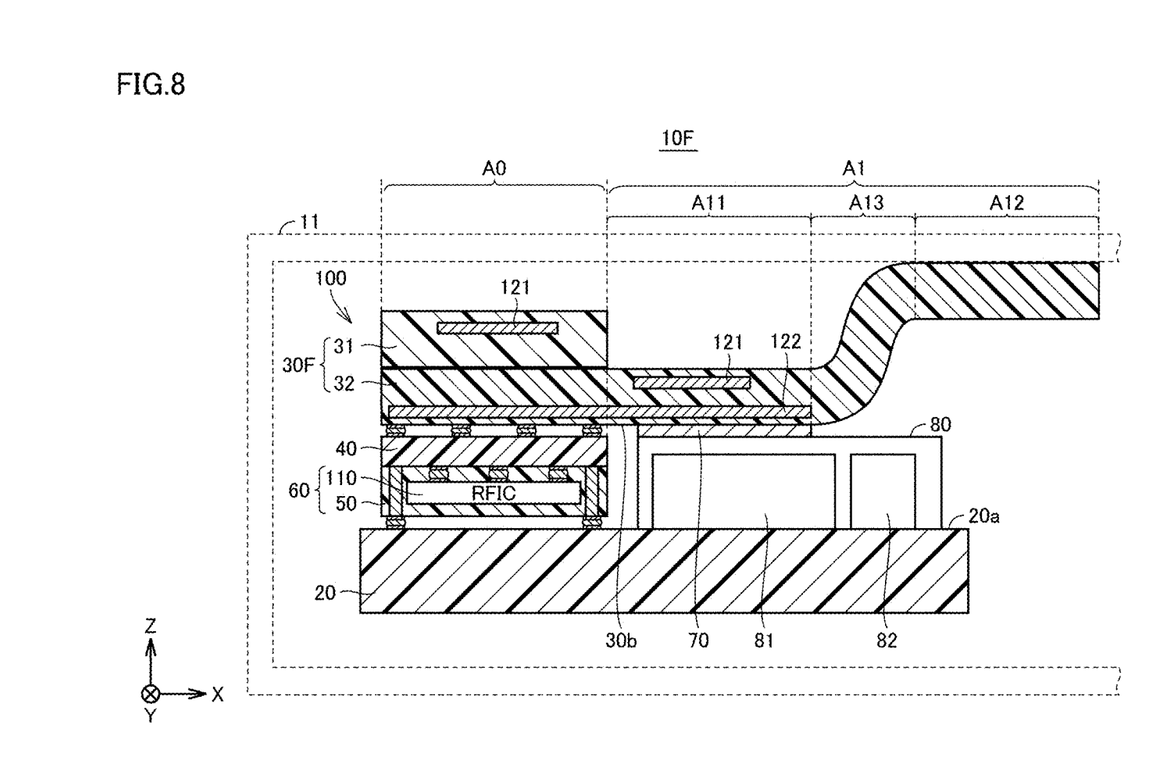
FIG. 8 is a perspective view of an inside of a communication device according to Modification Example 7.

FIG. 8 is a perspective view of an inside of a communication device 10F according to Modification Example 7. The communication device 10F includes an antenna substrate 30F instead of the antenna substrate 30 illustrated in FIG. 2. As in the case of the antenna substrate 30, the antenna substrate 30F also includes a mount portion A0 on which the RF module 60 is mounted and an overhang portion A1 that extends outward (in the X-axis positive direction) from the mount portion A0.

The mount portion A0 of the antenna substrate 30F is formed by laminating a rigid substrate 31 and a flexible substrate 32. The rigid substrate 31 is mounted on the flexible substrate 32 or connected to the flexible substrate 32 by, for example, adhesion. The ground electrode 122 is disposed in the flexible substrate 32 in the mount portion A0, and the antenna element 121 is disposed in the rigid substrate 31 in the mount portion AU.

The overhang portion A1 of the antenna substrate 30F includes only the flexible substrate 32 without the rigid substrate 31. The antenna element 121 in the overhang portion A1 is disposed in the flexible substrate 32. The ground electrode 122 extends across the mount portion A0 and the overhang portion A1 in the flexible substrate 32.

The overhang portion A1 of the antenna substrate 30F includes a first portion A11 where the antenna element 121 is disposed, a second portion A12 that is in contact with the housing 11, and a bend A13 disposed between the first portion A11 and the second portion A12. More specifically, in the antenna substrate 30F, an end portion of the overhang portion A1 in the X-axis positive direction is bent in the Z-axis positive direction and connected to the housing 11. Thus, the housing 11 covering the antenna module 100 is usable as an aspect of a heat dissipator.

As described above, the mount portion A0 of the antenna substrate 30F may have a laminate structure including the rigid substrate 31 and the flexible substrate 32, and the overhang portion A1 of the antenna substrate 30F may have a single layer structure including only the flexible substrate 32. The overhang portion A1 may be bent and connected to the housing 11.

FIG. 8 illustrates an example where an end portion of the antenna substrate 30F in the X-axis positive direction is directly connected to the housing 11. Instead, a heat dissipator may be additionally disposed between the end portion of the antenna substrate 30F in the X-axis positive direction and the housing 11.

Modification Example 8

In the communication device 10 illustrated in FIG. 2, the RF module 60 and the shielding case 80 are mounted on the single mount substrate 20. Instead, the RF module 60 and the shielding case 80 may be respectively mounted on different substrates.

The embodiments disclosed herein are mere examples in all respects and should be construed as being nonlimitative. The scope of the present disclosure is defined by the scope of claims instead of the description of the above embodiments, and is intended to include all the changes within the meaning and the scope equivalent to the scope of claims.

REFERENCE SIGNS LIST 10, 10A to 10F communication device
11 housing
20 mount substrate
20a, 30a upper surface
30, 30A to 30F antenna substrate
30b lower surface
30c side surface
31 rigid substrate
32 flexible substrate
40 circuit board
50 resin molding member
60 RF module
70, 70A1, 70A2 heat dissipator
71, 72, 73 electrically conductive member
74 via
80 shielding case
81, 82 electronic component
100 antenna module
111A to 113D, 117 switch
112AR to 112DR low-noise amplifier
112AT to 112DT power amplifier
114A to 114D attenuator
115A to 115D phase shifter
116 signal multiplexer/demultiplexer 118 mixer
119 amplifier circuit
120 antenna device
121, 121A1, 121A2 feed element
122, 122A, 122B, 122C, 122D ground electrode
A0 mount portion
A1, A2 overhang portion
A11 first portion
A12 second portion
A13 bend
Pg grounded portion
Ps feeder

The invention claimed is:

1. An antenna module, comprising:
an antenna substrate including a first surface, a second surface opposite to the first surface, and an antenna element;
a radio-frequency integrated circuit (RFIC) mounted on the second surface of the antenna substrate and connected to the antenna element; and
a heat dissipator comprising a thermally conductive material,
wherein the antenna substrate includes a mount portion on which the RFIC is mounted and an overhang portion that extends outward and away from the mount portion,
wherein at least part of the antenna element is disposed in the overhang portion of the antenna substrate either on the first surface of the antenna substrate or within the antenna substrate between the first surface and the second surface of the antenna substrate,
wherein the heat dissipator is disposed on the second surface of the antenna substrate in the overhang portion,
wherein the overhang portion includes
a first overhang portion that extends in a first direction, and
a second overhang portion that extends in a second direction different from the first direction,
wherein the antenna element includes
a first antenna element disposed in the first overhang portion, and
a second antenna element disposed in the second overhang portion, and wherein the heat dissipator includes
a first heat dissipator disposed on the second surface of the antenna substrate in the first overhang portion, and
a second heat dissipator disposed on the second surface of the antenna substrate in the second overhang portion.

2. The antenna module according to claim 1,
wherein the antenna element is a planar element that extends in a direction along the first surface of the antenna substrate, and
wherein the antenna substrate further includes a planar ground electrode disposed between the antenna element and the second surface of the antenna substrate.

3. The antenna module according to claim 2,
wherein the antenna substrate further includes an electrically conductive member that connects the ground electrode and the heat dissipator to each other.

4. The antenna module according to claim 3,
wherein the heat dissipator includes an electrically conductive material, and
wherein the ground electrode includes
a grounded portion that is grounded through the electrically conductive member and the heat dissipator, and
a feeder connected to the RFIC.

5. The antenna module according to claim 1,
wherein the heat dissipator includes an electrically conductive material,
wherein the antenna substrate further includes an electrically conductive member that connects the antenna element and the heat dissipator to each other, and
wherein the antenna element includes
a grounded portion grounded through the electrically conductive member and the heat dissipator, and
a feeder connected to the RFIC.

6. A communication device, comprising:
an antenna module; and
a mount substrate disposed across from the-an antenna substrate with a radio-frequency integrated circuit (RFIC) interposed therebetween, and on which the RFIC is mounted,
wherein the antenna module including
the antenna substrate including a first surface, a second surface opposite to the first surface, and an antenna element,
the RFIC mounted on the second surface of the antenna substrate and connected to the antenna element, and
a heat dissipator comprising a thermally conductive material,
wherein the antenna substrate includes a mount portion on which the RFIC is mounted and an overhang portion that extends outward and away from the mount portion,
wherein at least part of the antenna element is disposed in the overhang portion of the antenna substrate either on the first surface of the antenna substrate or within the antenna substrate between the first surface and the second surface of the antenna substrate,
wherein the heat dissipator is disposed on the second surface of the antenna substrate in the overhang portion,
wherein the overhang portion includes
a first overhang portion that extends in a first direction, and
a second overhang portion that extends in a second direction different from the first direction,
wherein the antenna element includes
a first antenna element disposed in the first overhang portion. and
a second antenna element disposed in the second overhang portion, and wherein the heat dissipator includes
a first heat dissipator disposed on the second surface of the antenna substrate in the first overhang portion, and
a second heat dissipator disposed on the second surface of the antenna substrate in the second overhang portion.

7. The communication device according to claim 6, wherein
the antenna element is a planar element that extends in a direction along the first surface, and
the antenna substrate further includes a planar ground electrode disposed between the antenna element and the second surface.

8. The communication device according to claim 7, wherein the antenna substrate further includes an electrically conductive member that connects the ground electrode and the heat dissipator to each other.

9. The communication device according to claim 8, wherein the heat dissipator includes an electrically conductive material, and the ground electrode includes a grounded portion that is grounded through the electrically conductive member and the heat dissipator, and a feeder connected to the RFIC.

10. The communication device according to claim 6, further comprising:

a contact member disposed between the heat dissipator and the mount substrate and in contact with the heat dissipator and the mount substrate.

11. The communication device according to claim 10, further comprising:

a housing that accommodates the antenna module and the mount substrate, wherein the heat dissipator is in contact with the housing.

12. The communication device according to claim 6, further comprising:

a housing that accommodates the antenna module and the mount substrate, wherein the heat dissipator is in contact with the housing.

13. An antenna module, comprising:

an antenna substrate including a first surface, a second surface opposite to the first surface, and an antenna element; and a radio frequency integrated circuit (RFIC) mounted on the second surface of the antenna substrate and connected to the antenna element, wherein the antenna substrate includes a mount portion on which the RFIC is mounted, and an overhang portion that extends outward and away from the mount portion, at least part of the antenna element is disposed in the overhang portion of the antenna substrate either on the first surface of the antenna substrate or within the antenna substrate between the first surface and the second surface of the antenna substrate, the mount portion of the antenna substrate includes a rigid substrate and a flexible substrate laminated one on top of another, the overhang portion of the antenna substrate is formed from the flexible substrate without the rigid substrate, and the antenna module further comprises a heat dissipator that is in contact with the overhang portion, the heat dissipator comprising a thermally conductive material.

14. The antenna module according to claim 13, wherein the overhang portion of the antenna substrate includes a first portion in which the antenna element is disposed, a second portion that is in contact with the heat dissipator, and a bend that is disposed between the first portion and the second portion.

15. The antenna module according to claim 14, wherein the heat dissipator comprises a housing that covers the antenna module.

16. The antenna module according to claim 13, wherein the overhang portion includes a first overhang portion that extends in a first direction, and a second overhang portion that extends in a second direction different from the first direction, wherein the antenna element includes a first antenna element disposed in the first overhang portion, and a second antenna element disposed in the second overhang portion, and wherein the heat dissipator includes a first heat dissipator disposed on the second surface of the antenna substrate in the first overhang portion, and a second heat dissipator disposed on the second surface of the antenna substrate in the second overhang portion.

* * * * *